(12) United States Patent
Guidash

(10) Patent No.: US 6,710,804 B1
(45) Date of Patent: Mar. 23, 2004

(54) CMOS ACTIVE PIXEL IMAGE SENSOR WITH EXTENDED DYNAMIC RANGE AND SENSITIVITY

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/484,156

(22) Filed: Jan. 18, 2000

(51) Int. Cl.[7] .............................. H04N 3/14; H04N 5/335
(52) U.S. Cl. ......................... 348/302; 257/233; 348/275
(58) Field of Search ................................ 348/274, 275, 348/281, 302, 303, 304, 310, 315, 308; 257/233, 239, 291, 292

(56) References Cited

U.S. PATENT DOCUMENTS

| | | | |
|---|---|---|---|
| 5,130,774 A | 7/1992 | Stevens et al. | 357/24 |
| 5,306,931 A | 4/1994 | Stevens | 257/223 |
| 5,349,215 A | 9/1994 | Anagnostopoulos et al. | 257/223 |
| 5,587,596 A | 12/1996 | Chi et al. | 257/223 |
| 5,608,243 A | 3/1997 | Chi et al. | 257/249 |
| 5,614,744 A | 3/1997 | Merrill | 257/291 |
| 5,625,210 A | 4/1997 | Lee et al. | 257/292 |
| 5,650,643 A | 7/1997 | Konuma | 257/225 |
| 5,841,158 A | 11/1998 | Merrill | 257/233 |
| 5,872,371 A | 2/1999 | Guidash et al. | 257/230 |
| 5,903,021 A | 5/1999 | Lee et al. | 257/292 |
| 5,952,686 A | 9/1999 | Chou et al. | 257/292 |
| 5,965,875 A * | 10/1999 | Merrill | 250/226 |
| 6,307,195 B1 * | 10/2001 | Guidash | 250/208.1 |

FOREIGN PATENT DOCUMENTS

| | | | |
|---|---|---|---|
| EP | 0 809 303 A1 | 11/1997 | H01L/31/232 |
| EP | 0 854 516 A2 | 7/1998 | H01L/27/146 |
| EP | 0 886 318 A1 | 12/1998 | H01L/27/146 |
| JP | 05207376 | 8/1993 | H04N/5/335 |
| JP | 09064332 | 3/1997 | H01L/27/146 |
| JP | 2000059688 | 2/2000 | H04N/5/335 |

OTHER PUBLICATIONS

Orly Yadid–Pecht et al., "Wide Intrascene Dynamic Range CMOS APS Using Dual Sampling"; 1997 IEEE Workshop on Charge–Coupled Devices and Advanced Image Sensors; paper #R15.

Sypros Kavadias et al., "On–chip Offset Calibrated Logarithmic Response Image Sensor", 1999 IEEE Workshop on Charge–Coupled Devices and Advanced Image Sensors, pp. 68–71.

(List continued on next page.)

Primary Examiner—Wendy R. Garber
Assistant Examiner—Matthew L Rosendale
(74) Attorney, Agent, or Firm—Peyton C. Watkins

(57) ABSTRACT

A semiconductor based X-Y addressable imager having an imaging array with a plurality of the pixels within the X-Y addressable imager, a photodetector within each of the plurality of pixels configured to sense a first bandwidth of light, a sense node within each of the pixels configured to sense a second bandwidth of light, a reset mechanism operatively configured to the photodetector and the sense node to allow resetting each of the photodetector and the sense node to a predetermined potential, the sense node being formed such that it does not have a light shield allowing the sense node to act as a second photodetector, and a transfer mechanism within each of plurality of pixels configured to transfer charge from the photodetector to the sense node. The X-Y addressable sensor in this embodiment can have either the first and second bandwidths being different, or the first and second bandwidths are the same.

Another embodiment envisions the X-Y addressable imager is formed such that the bandwidth detected by the sense node and the photodetector is the same allowing for increased dynamic range of the photodetector.

53 Claims, 4 Drawing Sheets

OTHER PUBLICATIONS

M. Loose et al., "Self–Calibrating Logarithmic CMOS Image Sensor with Single Chip Camera Functionality", 1999 IEEE Workshop on Charge–Coupled Devices and Advanced Image Sensors, pp. 191–194.

N. Ricquier, et al., "Active Pixel CMOS Image Sensor with On–Chip Non–Uniformity Correction", 1995 IEEE Workshop on Charge–Coupled Devices and Advanced Image Sensors.

J. Huppertz et al., "Fast CMOS Imaging with High Dynamic Range", 1997 IEEE Workshop on Charge–Coupled Devices and Advanced Image Sensors, pp. 1–4.

S. Decker et al., "Comparison of CCD and CMOS Pixels for a Wide Dynamic Range Area Imager", 1995 IEEE Workshop on Charge–Coupled Devices and Advanced Image Sensors, pp. 1–5.

S. Decker et al., "A 256×256 CMOS Imaging Array with Wide Dynamic Range Pixels and Column–Parallel Digital Output", IEEE Journal of Solid–State Circuits, vol. 33, No. 12, Dec. 1998, pp. 2081–1091.

* cited by examiner

CMOS ACTIVE PIXEL IMAGE SENSOR WITH EXTENDED DYNAMIC RANGE AND SENSITIVITY

FIELD OF THE INVENTION

The present invention pertains to semiconductor based image sensors and more particularly to Active Pixel image sensors (APS) having high sensitivity and increased dynamic range.

BACKGROUND OF THE INVENTION

APS are solid state imagers wherein each pixel contains both a photosensing means and at least one other active component, creating a charge that is converted to a signal (either a voltage or current signal). The signal represents the amount of light incident upon a pixel photosite. The dynamic range (DR) of an imaging sensing device is defined as the ratio of the effective maximum detectable signal level, typically referred to as the saturation signal, ($V_{sat}$), with respect to the rms. noise level of the sensor, ($\sigma_{noise}$) This is shown in Equation 1.

$$\text{Dynamic Range} = V_{sat}/\sigma_{noise} \quad \text{Equation 1:}$$

Image sensor devices such as charge coupled devices (CCD) that integrate charge created by incident photons have dynamic range limited by the amount of charge that can be collected and held in a given photosite, ($V_{sat}$). For example, for any given CCD, the amount of charge that can be collected and detected in a pixel is proportional to the pixel area. Thus for a commercial device used in a megapixel digital still camera (DSC), the number of electrons representing Vsat is on the order of 13,000 to 20,000 electrons. If the incident light is very bright and creates more electrons that can be held in the pixel or photodetector, these excess electrons are extracted by the anti-blooming means in the pixel and do not contribute to an increased saturation signal. Hence, the maximum detectable signal level is limited to the amount of charge that can be held in the photodetector or pixel. The DR is also limited by the sensor noise level, $\sigma_{noise}$. Due to the limitations on Vsat, much work has been done in CCD's to decrease $\sigma_{noise}$ to very low levels. Typically, commercial megapixel DSC devices have a DR of 1000:1 or less.

The same limitations on DR exist is for APS devices. The $V_{sat}$ is limited by the amount of charge that can be held and isolated in the photodetector. Excess charge is lost. This can become even more problematic with APS compared to CCD due to the active components within the pixel in the APS, limiting the area available for the photodetector, and due to the low voltage supply and clocks used in APS devices. In addition, since APS devices have been used to provide image sensor systems on a chip, the digital and analog circuits used on APS devices such as timing and control and analog to digital conversion, that are not present on CCD's, provide a much higher noise floor on APS devices compared to CCD. This is due to higher temporal noise as well as possibly quantization noise from the on-chip analog to digital converter.

In commonly assigned U.S. patent application Ser. No. 09/426,870, Guidash explains the prior art approaches to extending dynamic range of APS devices, and discloses a new invention to extend dynamic range by collection of the charge that blooms from the photodetector. While that approach does provide extended dynamic range with a small pixel, it has the potential disadvantage of spatial variation of the photodetector saturation level contributing to fixed pattern noise in the sensor, and does not increase the sensitivity of the sensor.

Prior art APS devices also suffer from poor sensitivity to light due to the limited fill factor induced by integration of active components in the pixel, and by loss of transmission of incident light through the color filter layer placed above the pixel.

From the foregoing discussion it should be apparent that there remains a need within the prior art for a device that retains provides extended dynamic range while retaining low fixed pattern noise, small pixel, and high sensitivity.

SUMMARY OF THE INVENTION

According to the present invention, there is provided a solution to problems of the prior art. In the present invention, the floating diffusion region in each pixel is used as a separate photodetector region to provide extended dynamic range and high sensitivity.

A first embodiment of the present invention provides extended dynamic range and higher sensitivity by utilizing a floating diffusion region without a light shield provided in each pixel as a separate photodetector region. During integration of signal charge on the photodetector, charge is also collected on the floating diffusion in proportion to the light incident on the floating diffusion region. In prior art devices the floating diffusion region is used as the charge to voltage conversion node, as an overflow drain for the photodetector during integration, or as a charge storage region for global frame capture. As a result, the floating diffusion region is either shielded from incident light, or is held in a reset mode to prevent the accumulation of charge resulting from light incident on or near the floating diffusion region, and to drain the blooming charge from the photodetector region. In the present invention charge is integrated on the floating diffusion in proportion to the amount of light incident upon the floating diffusion for a period of time that is controlled independently from the photodetector integration time. The charge integrated on the floating diffusion is then read out separately from the charge integrated on the photodetector. In this first embodiment the photodetector and floating diffusion in a given pixel are covered by the same color filter, or are both not covered by any color filter.

A second embodiment of the present invention provides extended dynamic range and high sensitivity to incident light by utilizing the first embodiment with a different or separate color filter for the photodetector and floating diffusion region in a given pixel. This provides a signal charge associated with 2 colors per pixel.

According to the present invention, an active pixel sensor device that significantly increases the dynamic range and sensitivity of the device, and can be used in current system designs is provided by: an X-Y addressable imager having a plurality of the pixels within the X-Y addressable imager with a photodetector within each of the plurality of pixels configured to sense a first bandwidth of light; a sense node within each of the pixels configured to sense a second bandwidth of light; a reset mechanism operatively configured to the photodetector and the sense node to allow resetting each of the photodetector and the sense node to a predetermined potential, the sense node being formed such that it does not have a light shield allowing the sense node to act as a second photodetector; and a transfer mechanism within each of plurality of pixels configured to transfer charge from the photodetector to the sense node. The first and second bandwidths can be different or the same depending upon design choices. The X-Y addressable imager is envisioned as comprising a system with a first storage mechanism to store a signal associated with charge accumulated on the sense node, a second storage mechanism to store a signal associated with charge accumulated on the photodetector and a timing circuit for controlling the integration and transfer timing of the sense node and the photodetector for each of the plurality of pixels.

ADVANTAGEOUS EFFECT OF THE INVENTION

The invention has the following advantages. It provides for extending the dynamic range and sensitivity of a sensor that can easily be employed within current sensor and pixel designs with little or no modification. Small pixels with high fill factor can provide separate signals from 2 colors per pixel.

DETAILED DESCRIPTION OF THE INVENTION

Figure 1A:
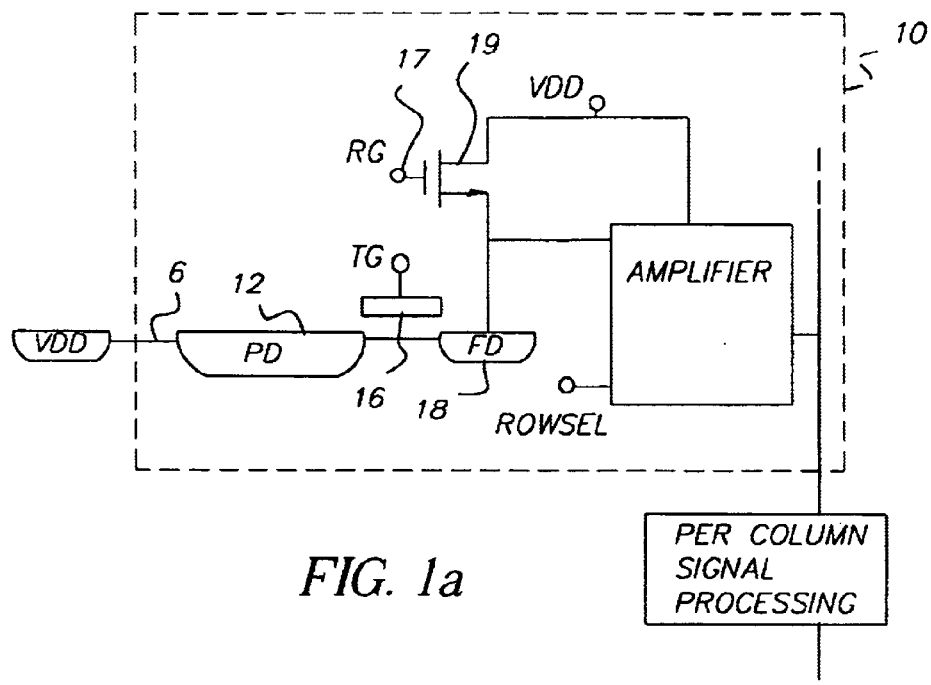
FIG. 1a is a diagram of a pixel of a first embodiment of the present invention that extends the dynamic range by integration of photoelectrons created from incident photons on both the photodetector and floating diffusion.

The first embodiment of the present invention provides extended dynamic range and higher sensitivity by utilizing a floating diffusion region without a light shield provided in each pixel as a separate photodetector region. During integration of signal charge on the photodetector, charge is also collected on the floating diffusion in proportion to the light incident on the floating diffusion region. The integration time of the floating diffusion region is controlled independently from that of the photodetector. This is accomplished using the pixel shown in FIGS. 1a and 1b. This is a similar pixel design to that disclosed by Guidash in commonly assigned U.S. patent application Ser. Nos. 09/426,870 and 09/130,665. This pixel 10 comprises a photodetector 12 (preferably a pinned photodiode P), a transfer gate 16, a floating diffusion 18, a row select transistor 7, a reset transistor comprised of a source being the floating diffusion 18, reset gate 17 and reset drain 19, and a lateral overflow region 6.

Figure 1B:
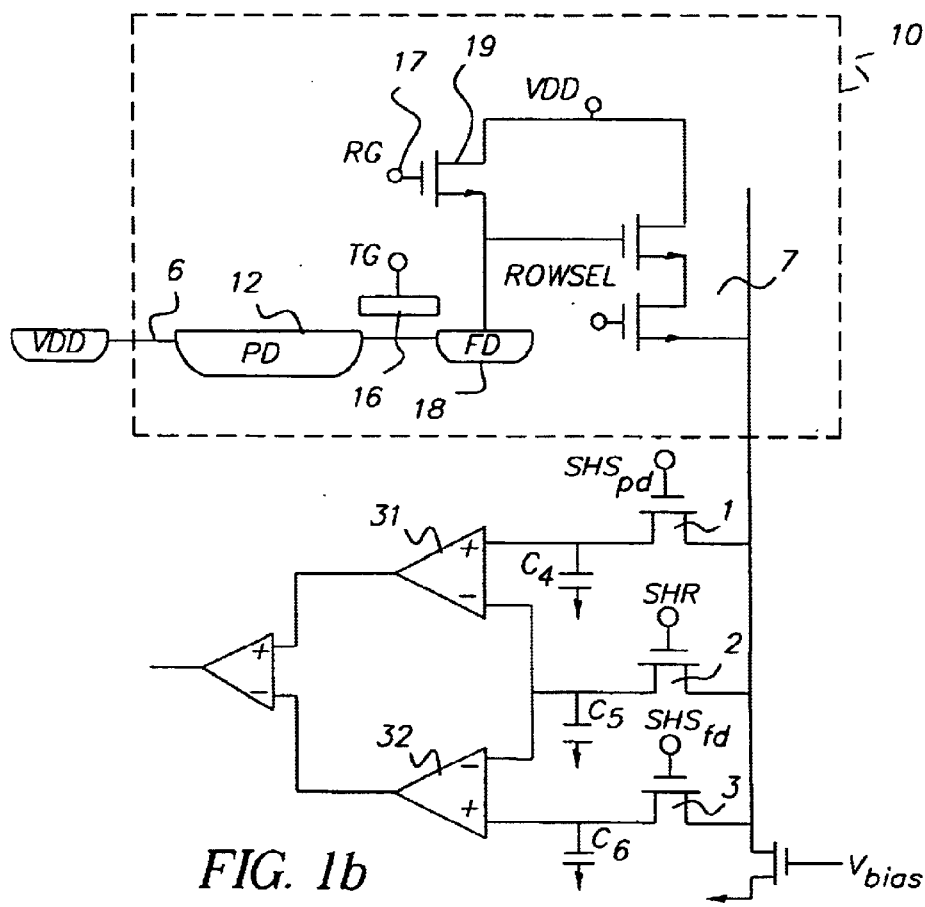
FIG. 1b is diagram of a pixel of a first embodiment of the present invention shown in FIG. 1a further detailing the per column signal processing.

FIG. 1b is a diagram of a pixel of a first embodiment of the present invention shown in FIG. 1a further detailing the per column signal processing. The pixel 10, illustrated in FIG. 1b, is preferably part of an X-Y addressable array of pixels that are arranged in row and columns. Typically, the readout of charge accumulated within the pixels is accomplished by selecting one row at a time and readout out the columns within that row. Each column will have circuits for processing the outputs of the individual pixels. The column circuits envisioned by the present invention are transistors 1, 2, and 3 which operate as switches under control of gate signals $SHS_{pd}$, SHR and $SHS_{fd}$ to store signals within, respectively, capacitors $C_4$, $C_5$, and $C_6$. The signals from pixel 10 that are stored under control of $SHS_{pd}$, SHR and $SHS_{fd}$ within capacitors $C_4$, $C_5$, and $C_6$ are used as inputs to differential amplifiers 31, 32 which compare a reset value for the floating diffusion 18 with the accumulated signal values from each of the floating diffusion 18 and the photodetector 12.

Figure 2:
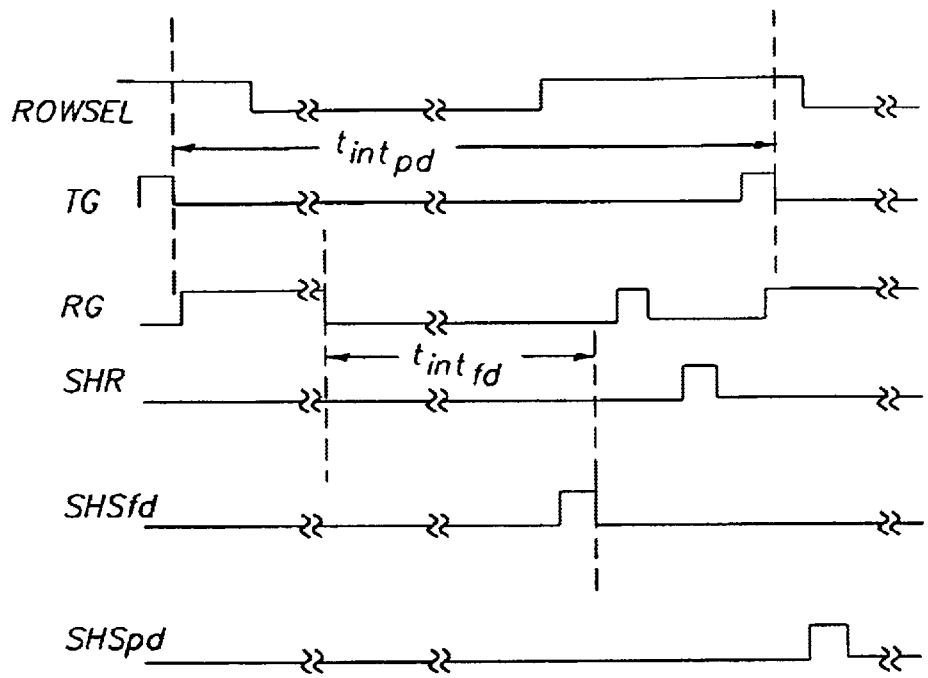
FIG. 2 is a timing diagram for the pixel shown in FIG. 1b.
Figure 3A:
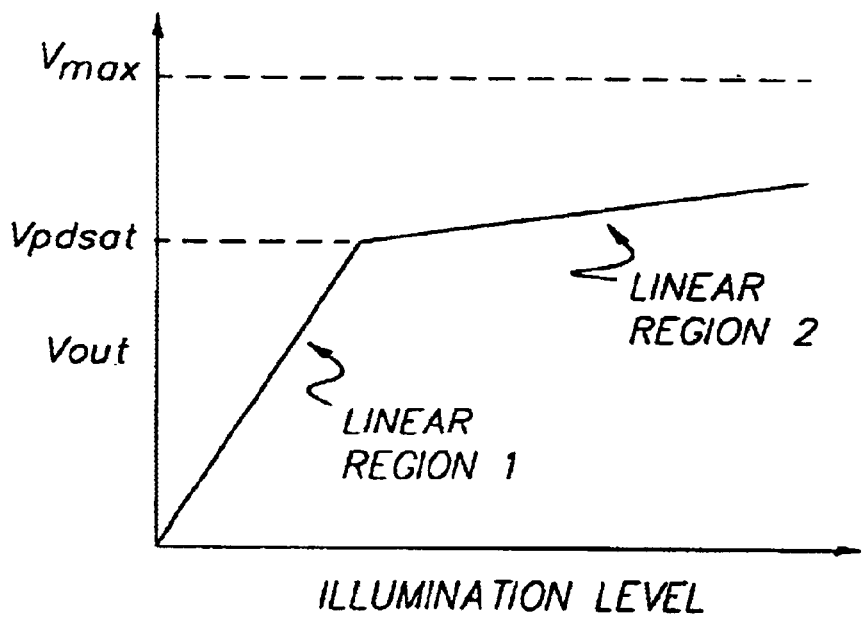
FIG. 3a illustrates a pair of transfer functions for the pixel in FIG. 1b operated by the timing diagram shown in FIG. 2 having a short floating diffusion integration time leading,to a small slope for linear region 2.
Figure 3B:
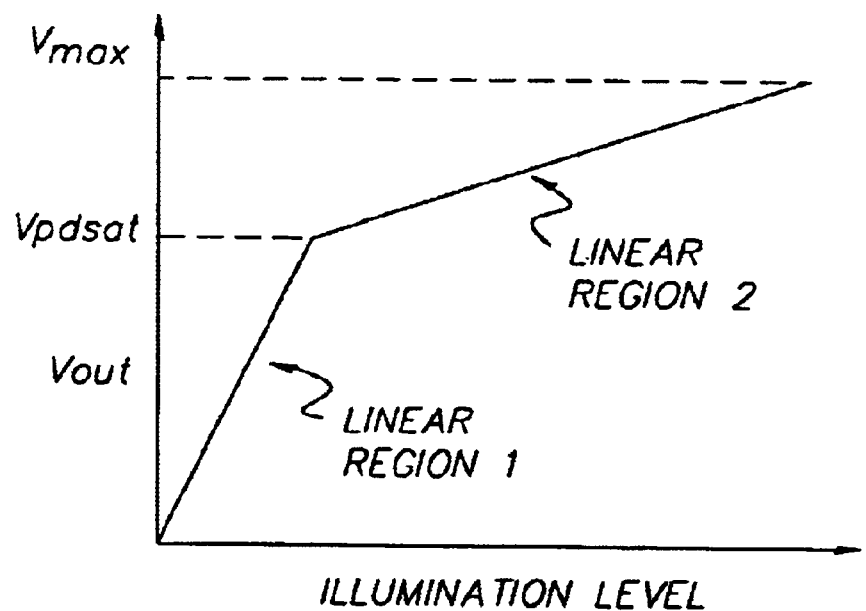
FIG. 3b illustrates a pair of transfer functions for the pixel in FIG. 1b operated by the timing diagram shown in FIG. 2 having a relatively longer floating diffusion integration time leading to a larger slope for linear region 2.

Operation of the first embodiment of the present invention is shown in the timing diagram of FIG. 2 for the pixel 10 of FIG. 1b, resulting in the output signal transfer function shown in FIGS. 3a and 3b. Referring to FIG. 2, the pixel 10 is reset or initialized by transferring charge from the photodetector 12 to the floating diffusion 18 by pulsing of the transfer gate 16 (shown as signal TG) on and off, and the subsequent resetting of the floating diffusion 18 by the activation of reset gate 17 which resets the floating diffusion 18 to a potential determined by the reset gate pulse width, reset transistor threshold voltage, and potential of the reset drain 19. The photodetector integration time ($t_{intpd}$) commences when the transfer gate 16 is turned off after the initialization or reset sequence. The reset gate is left on. The electrostatic potential of the lateral overflow region is set at a level deeper than the transfer gate off potential so that excess charge in the photodetector will bloom through the lateral overflow region and into the reset drain of the adjacent pixel. The overflow mechanism prevents charge from blooming into the floating diffusion and corrupting the charge accumulated on the floating diffusion. The overflow mechanism can be any means known within the art. As photodetector integration time ($t_{intpd}$) proceeds, the floating diffusion can also begin integration. The floating diffusion integration time commences when the reset gate is turned off. The amount of time elapsed between turning off the reset gate and the resetting of the floating diffusion is referred to as the floating diffusion integration time, $t_{intpd}$. At the end of desired photodetector integration time, $t_{intpd}$, the level of charge integrated on the floating diffusion 18 is sampled and held by pulsing $SHS_{fd}$ which places the floating diffusion 18 signal on Capacitor $C_4$, followed by a reset of the floating diffusion 18 by RG and a sample and hold of the reset level by $SHR_{fd}$ which places the floating diffusion reset level on Capacitor $C_5$. Charge is then transferred from the photodetector 12 to the floating diffusion 18 by pulsing TG 16 on and off, and that signal level is then sampled and held by $SHS_{pd}$ and placed on Capacitor $C_6$. The sampled and held signal levels from the photodetector and the floating diffusion can then be added in the voltage domain to provide a total signal. One example of this is shown in FIG. 1b. The present invention envisions a differential readout for the floating diffusion signal on capacitor $C_4$ and the reset level on capacitor $C_5$ via differential amplifier 31, and a second differential readout for the photodetector signal level on capacitor $C_6$ and the reset level on capacitor $C_5$ via differential amplifier 32, thus providing true correlated double sampling for the photodetector signal level. The final output signal can then be determined by several means. One is reading the signals from the two differential amplifiers 31 and 32 separately providing two signal values per pixel that can be added off-chip. A second embodiment is accomplished by providing the signals as inputs to a third amplifier and subsequent signal processing chain in order to read out the signal out as a single level per pixel. This readout method of combining the signal in the voltage domain also provides a larger maximum pixel signal level Vmax than combining the signals in the charge domain. This is because the floating diffusion does not have to hold the integrated photodetector signal and integrated floating diffusion signal simultaneously. Hence the Vmax is extended to be the full floating diffusion capacity plus the photodetector capacity.

Since this method utilizes differential readout of the pixel with respect to a reference reset level, the pixel offset noise is cancelled. Additionally the dynamic range is extended without any additional components in the pixel, so that it can be accomplished with small pixels that are practical for low cost consumer digital imaging applications. The sensitivity of the pixel is increased since both the floating diffusion and photodetector are used for integration, providing a larger photoactive area in the pixel. Since the floating diffusion is integrating charge created from light incident on the floating diffusion rather than collecting charge that blooms from the photodetector, fixed pattern noise from variation of the point at which charge blooms from the photodetector is eliminated. With this approach pixel read noise of charge integrated on the floating diffusion will be increased due to the reset level being uncorrelated to the floating diffusion signal level. This will be typically less than 30 electrons and is small compared to the gain in effective signal level.

As a result of the operation described for FIG. 2 the sensor output response will be as shown in FIGS. 3a and 3b. The output response comprises two regions. For low light levels the output response will follow linear region 1. The slope of linear region 1 is a superposition of the responses provided by the photodetector and the floating diffusion, and is proportional to the integration time of both the photodetector and floating diffusion. As the number of photoelectrons exceeds the capacity of the photodetector, this charge will flow through the lateral overflow region and be removed via the reset drain or VDD of the adjacent pixel. The photodetector signal charge will saturate at this point referred to as $V_{pdsat}$. At this point the pixel output response will follow linear region 2. The preferred embodiment provides a linear response in linear region 2, by the timing shown in FIG. 2. The slope of linear region 2 is dependent on and directly proportional to the floating diffusion integration time $t_{intfd}$. The two FIGS. (3a and 3b) illustrate the two different slopes for linear region 1 and linear region 2. The floating diffusion integration time in FIG. 3a is shorter than that for FIG. 3b. Consequently, the slope of linear region 1 and linear region 2 in FIG. 3b is greater than that for FIG. 3a.

The dynamic range is extended in two ways. First, since the floating diffusion region is used to integrate and store photoelectrons, the maximum capacity of electrons is larger than just using the photodetector. Second, by using different integration times for the photodetector and floating diffusion regions, an effective or extrapolated signal level, Veff, can be determined from the ratio of the integration times of the photodetector and floating diffusion, the ratio of responsivities of the photodetector and floating diffusion, and the measured signal level from each. Since the ratio of the photodetector integration time $t_{intpd}$ to the floating diffusion integration time $t_{intfd}$ can be made large, Veff can be increased substantially over the signal limited by the photodetector and floating diffusion capacity.

It is also possible to display the sensor output signal directly without determining the effective signal level from linear region 2. This still provides extended instrascene dynamic range by mapping and directly displaying a larger incident illuminant range into the directly detectable signal voltage range. This direct output response is what is illustrated in FIGS. 3a and 3b.

Figure 4:
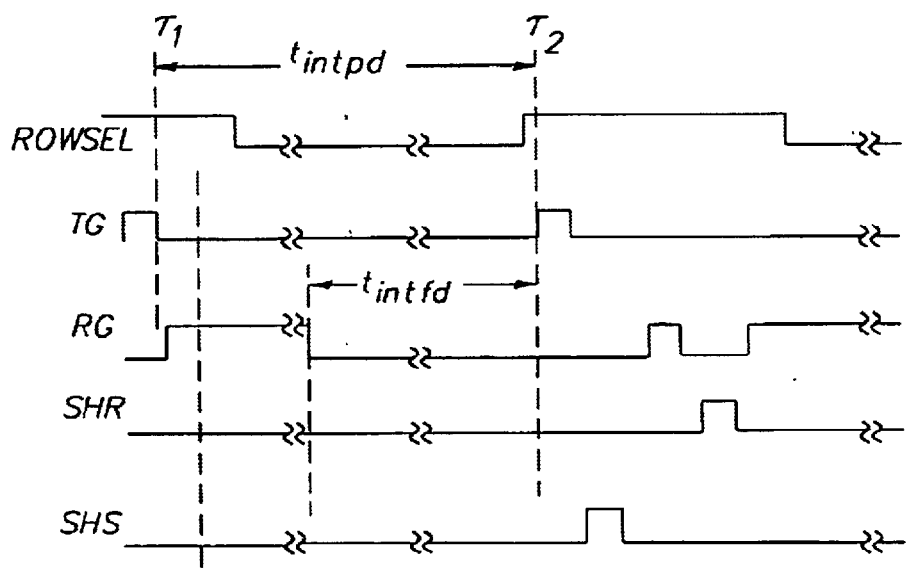
FIG. 4 is a timing diagram for the pixel shown in FIG. 1b.

The timing diagram shown in FIG. 2 shows the preferred embodiment of separate readouts of the charge on the floating diffusion and the photodetector. In this case, the signals are combined in the voltage domain. The readout could also be accomplished via a single readout where the signal charge in the photodetector is transferred to the floating diffusion and the combined charge is readout as shown in FIG. 4. This has the advantage of a single readout and thus faster readout time, but has the disadvantage of smaller effective charge capacity, and an uncorrelated differential readout.

Figure 5:
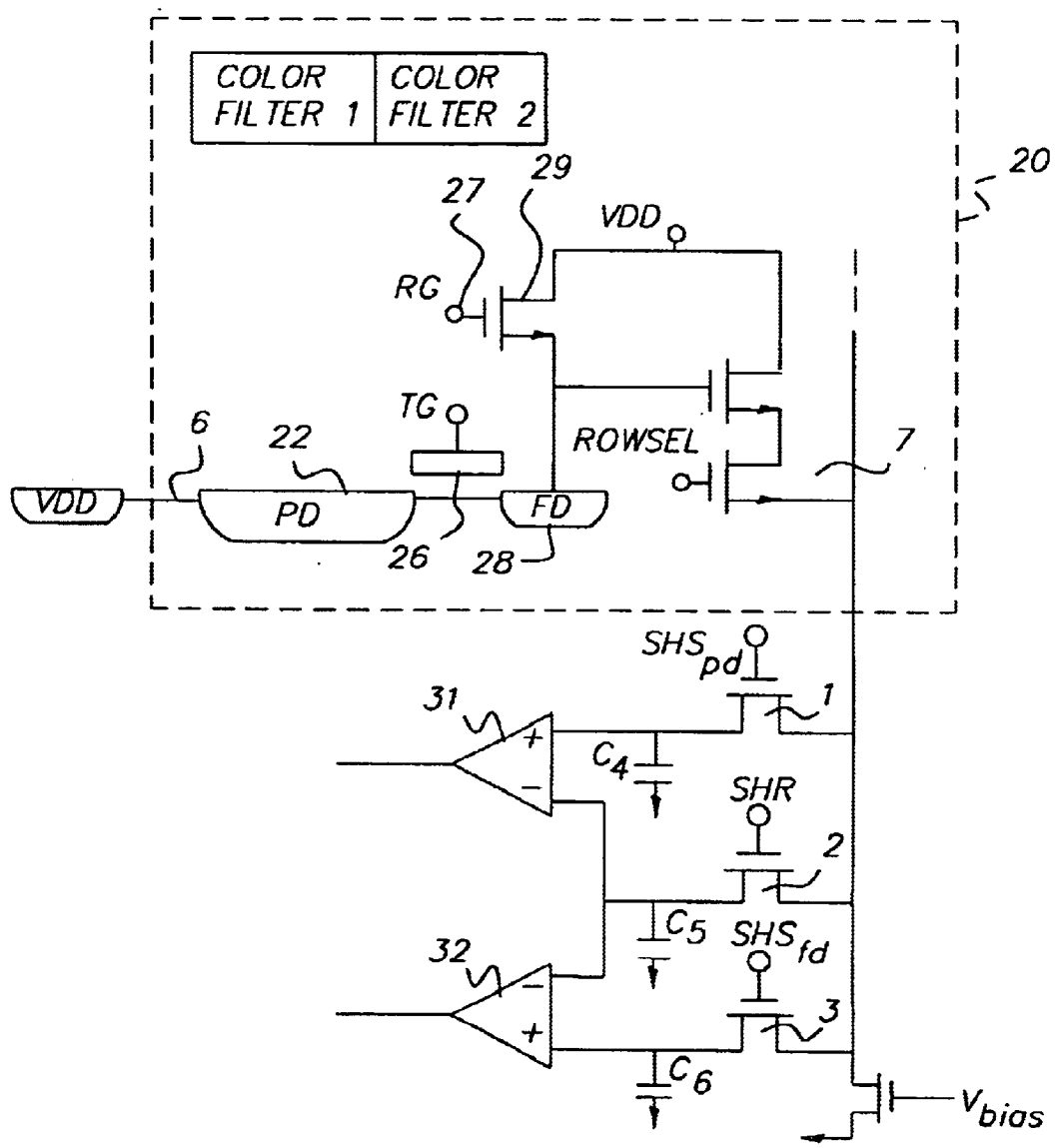
FIG. 5 is a diagram of a pixel of a second embodiment of the present invention that extends the dynamic range by integration of photoelectrons created from incident photons on both the photodetector and floating diffusion.

The second embodiment of the present invention utilizes the method of separate readouts of charge from the floating diffusion 28 and photodetector 22 combined with two different color filters 1 and 2 provided over the photodetector 22 and floating diffusion 28 within a given pixel 20. This is shown in FIG. 5. With this invention, signal levels associated with two different colors can be obtained and separately quantified from each pixel site. Referring to FIG. 5, the second embodiment of the present invention is illustrated wherein charge that has accumulated on the floating diffusion 28 is stored on capacitor $C_6$ by timing signal $SHS_{fd}$. In a manner consistent with the timing diagram shown in FIG. 2, the reset signal is applied to the reset gate (RG) 27 after the $SHS_{fd}$ signal resulting in a reset of the floating diffusion 28 and that potential level of the floating diffusion 28 is then stored on capacitor $C_5$ by application of timing signal SHR. Charge that has accumulated within the photodetector 22 is then transferred to the floating diffusion 28 by timing signal TG. This photodetector 22 charge on the floating diffusion 28 is then stored on capacitor $C_4$ by activation of the timing signal $SHS_{pd}$. The preferred embodiment of the present invention envisions that a differential readout be employed to read the floating diffusion 28 signal level of color filter 1 on capacitor $C_4$ using the reset level on capacitor $C_5$ as a reference input into differential amplifier 31. A second differential readout for the photodetector 22 signal level of color filter 2 on capacitor $C_6$ via differential amplifier 32 with the reset level on capacitor $C_5$ again as the reference input, thus providing true correlated double sampling for the photodetector 22 signal level. The final output signal can then be determined by several means. One is reading the signals from the two differential amplifiers 31 and 32 separately providing two signal values per pixel that can be added off-chip. It is envisioned that the output of the second embodiment be derived by providing the color filter 1 and color filter 2 signals as inputs to a third amplifier and signal processing chain to read out the signal out as a single color difference level per pixel. This could also be done in any manner that provided either a color difference or color addition in the analog voltage domain per pixel, or any manner that uses the two color signals from within a single pixel or from neighboring pixels to obtain a desired combination of those signals.

Another method of deriving the final output signal within the second embodiment is to have one of the colors be representative of white light. In this version of the second embodiment the color filter would actually be an empty space over either the floating diffusion 28 or the photodetector 22. Preferably, the empty space is created over the floating diffusion 28 or photodetector 22 by having no color filter thus yielding a white filter. Because the white filter would accumulate photoelectrons faster than the color filter over the photodetector 22 or floating diffusion 28, the sensitivity of the pixel 20 can be increased while maintaining a color signal associated with each pixel 20. With this method the image sensor could be used as either a color or monochrome sensor.

Another method is to provide a green color filter associated with the photodetector or floating diffusion region in each pixel. In this embodiment, a more accurate luminance sample per pixel can be created. Prior art devices will typically create the luminance channel at each pixel from interpolation of color filtered light samples of adjacent pixels. This can provide lower noise images since noise associated with color filter interpolation will not be present. Also, digital imaging techniques can be expanded and altered to employ the features provided by the present invention.

Although not shown in the diagrams this approach can be done with many variations obvious to those skilled in the art. For example, the photodetector could be a photogate, the reset transistor could be replaced by any reset means, the lateral overflow region could be a lateral overflow gate, or other overflow means, the row select transistor could be replaced by any row select means. Each pixel could have a different color pair.

The foregoing discussion describes the embodiments most preferred by the inventor. Numerous variations will be readily apparent to those skilled in the relevant art. Therefore, the scope of the invention should be measured not by the disclosed embodiments but by the appended claims.

PARTS LIST 1 transistor
2 transistor
3 transistor
6 lateral overflow region
7 row select transistor
10 pixel
12 photodetector
16 transfer gate
17 reset gate
18 floating diffusion
19 reset drain
20 pixel
22 photodetector
26 transfer gate
27 reset gate
28 floating diffusion
29 reset drain
31 differential amplifier
32 differential amplifier
$C_4$ capacitor
$C_5$ capacitor
$C_6$ capacitor
color filter 1
color filter 2
linear region 1
linear region 2
$SHS_{fd}$ sample hold signal floating diffusion
SHS sample hold reset
$SHS_{pd}$ sample hold signal photodetector
$t_{intpd}$ photodetector integration time
$t_{intfd}$ floating diffusion integration time

What is claimed is:

1. A semiconductor based X-Y addressable imager having an imaging array comprising a plurality of pixels:
at least one pixel within the X-Y addressable imager having a photodetector configured to sense a first bandwidth of light, a sense node within the pixel configured to sense a second bandwidth of light, a reset mechanism operatively configured to the photodetector and the sense node to allow resetting each of the photodetector and the sense node to a predetermined potential, the sense node being formed such that it does not have a light shield allowing the sense node to act as a second photodetector and a transfer mechanism within the pixel configured to transfer charge from the photodetector to the sense node.

2. The X-Y addressable sensor of claim 1 wherein the first and second bandwidths are different.

3. The X-Y addressable sensor of claim 1 wherein the first and second bandwidths are the same.

4. The X-Y addressable imager of claim 1 wherein the imaging array is further placed within a system comprising:
a first storage mechanism to store a signal associated with charge accumulated on the sense node;
a second storage mechanism to store a signal associated with charge accumulated on the photodetector; and
a timing circuit for controlling the integration and transfer timing of the sense node and the photodetector for the pixel.

5. The system of claim 4 wherein the timing mechanism further comprises a sense node sampling signal to store a sense node signal proportional to the charge that has accumulated in the sense node within the first storage mechanism, a reset signal to reset the sense node after charge accumulated in the sense node has been stored in the first storage mechanism, a transfer signal to transfer charge accumulated within the photodetector to the sense node after the sense node has been reset by the reset signal and a photodetector sampling signal to store a photodetector signal that is proportional to charge that has accumulated in the photodetector within the second storage mechanism.

6. The system of claim 5 further comprising a reset storage device and wherein the timing mechanism further comprises a reset sampling signal to sample a reset potential of the sense node for each of the plurality of pixels and a circuit capable of determining the difference between the sampled reset potential and either the first or second storage mechanisms.

7. The system of claim 4 further comprising a reset storage device and wherein the timing mechanism further comprises a reset sampling signal to sample a reset potential of the sense node for each of the plurality of pixels and a circuit capable of determining differences between the sampled reset potential and both the first storage means and the second storage means.

8. The sensor of claim 1 wherein the pixel further comprises an amplifier and a row select signal as a control input to the amplifier.

9. The sensor of claim 1 wherein the first bandwidth is determined via a color filter over the photodetector element and the second bandwidth is selected as being either green or white.

10. The sensor of claim 9 wherein the first bandwidth color varies between different pixels.

11. The sensor of claim 10 wherein the addressable X-Y imager further comprises a set of circuit elements that combines values representative of the varied color first bandwidths stored in the first storage mechanism and the values representative of the second bandwidth stored in the second storage mechanisms into at least one chrominance output channel and at least one output luminance channel.

12. The sensor of claim 2 wherein the first bandwidth is either green or white.

13. The sensor of claim 1 wherein the second bandwidth color varies among different pixels.

14. The sensor of claim 1 wherein color to both the first bandwidth and the second bandwidth varies among different pixels.

15. The system of claim 4 wherein the timing circuit further comprises separate integration timing for each of the photodetector and the sense node.

16. A method of forming an X-Y addressable MOS imager comprising the steps of:
provide a semiconductor based sensor having a plurality of pixels with at least one pixel having a sense node configured to sense a first bandwidth of light and a photodetector configured to sense a second bandwidth of light, a reset mechanism operatively configured to the photodetector and the sense node to allow resetting the photodetector and the sense node to a predetermined potential, the sense node being formed such that it does not have a light shield allowing the sense node to act as a second photodetector, and the pixel further comprising a transfer mechanism configured to transfer charge from the photodetector to the sense node.

17. The method of forming an X-Y addressable MOS imager of claim 16 wherein the providing step further comprises providing the photodetector and the sense node configured to sense the first and the second bandwidths such that they are different.

18. The method of forming an X-Y addressable MOS imager of claim 16 wherein the providing step further comprises providing the photodetector and the sense node configured to sense the first and the second bandwidths such that they are the same.

19. The method of forming an X-Y addressable MOS imager of claim 16 wherein the providing step further comprises providing the photodetector and the sense node configured to sense the first and the second bandwidths such that they vary between different pixels.

20. The method of claim 16 further comprising the step of forming the X-Y addressable imager within a system having a first storage mechanism used to store a signal level associated with charge accumulated on the sense node, a second storage mechanism used to store a signal level associated with charge accumulated on the photodetector and a timing circuit for controlling the integration and transfer timing of the sense node and the photodetector for the pixel.

21. The method of claim 20 wherein the providing step further comprises providing a sense node sampling signal for storing a sense node signal that is proportional to charge that has accumulated in the sense node within the first storage mechanism, a reset signal for resetting the sense node after charge accumulated in the sense node has been stored in the first storage mechanism, a transfer signal for transferring charge accumulated within the photodetector to the sense node after the sense node has been reset by the reset signal and a photodetector sampling signal to store a photodetector signal that is proportional to charge that has accumulated in the photodetector within the second storage mechanism.

22. The method of claim 20 wherein the step of providing further comprises providing a reset storage device and wherein the step of forming further comprises providing the timing mechanism with a reset sampling signal for sampling a reset potential of the sense node for the pixel.

23. The method of claim 20 wherein the step of forming further comprises forming a circuit capable for determining the difference between the sampled reset potential and either the first or second storage mechanisms.

24. The method of claim 20 wherein the step of forming further comprises forming a circuit for creating separate luminance and chrominance channels from charge stored in the first and second storage means.

25. The method of claim 16 wherein the step of providing further comprises providing each of the pixels with an amplifier.

26. The method of claim 16 wherein the step of providing further comprises providing each of the pixels with a row select signal as a control input to the amplifier.

27. The method of claim 20 wherein the step of forming further comprises forming a circuit that performs mathematical functions on values stored in the first and second storage mechanisms to determine an effective signal level as a result of the mathematical function performed on values stored in the first and second storage mechanisms.

28. The method of claim 27 wherein the step of forming further comprises creating the circuit to sum scaled components of values stored in the first and second storage areas.

29. The method of claim 16 wherein the step of forming further comprises forming the timing circuit further comprises separate integration timing for each of the photodetector and the sense node.

30. A semiconductor based X-Y addressable MOS imager comprising a plurality of pixels:
at least one pixel within the X-Y addressable MOS imager having a photodetector, a sense node within the pixel coupled to the photodetector through a transfer mechanism, a reset mechanism operatively configured to the photodetector and the sense node to allow resetting each of the photodetector and the sense node to a predetermined potential, and wherein the sense node is formed such that it does not have a light shield allowing the sense node to act as a second photodetector, and the pixel further comprising a transfer mechanism configured to transfer charge from the photodetector to the sense node.

31. The X-Y addressable MOS imager of claim 30 wherein the imager is placed within a system, the system further comprising:
a first storage mechanism used to store a signal level associated with charge accumulated on the photodetector;
a second storage mechanism used to store a signal level associated with charge accumulated on the sense node; and
a timing circuit for controlling the integration and transfer timing of the pixel.

32. The system of claim 31 wherein the timing mechanism further comprises a sense node sampling signal to store charge that has accumulated in the sense node within the second storage mechanism, a reset signal to reset the sense node after charge accumulated in the sense node has been stored in the second storage mechanism, a transfer signal to transfer charge accumulated within the photodetector to the sense node after the sense node has been reset by the reset signal and a photodetector sampling signal to store charge that has accumulated in the photodetector within the first storage mechanism.

33. The system of claim 31 further comprising a reset storage device and wherein the timing mechanism further comprises a reset sampling signal to sample a reset potential of the sense node for each of the plurality of pixels.

34. The system of claim 31 wherein the X-Y addressable imager further comprises a circuit capable of determining the difference between the sampled reset potential and either the first or second storage mechanisms.

35. The system of claim 34 wherein the circuit is further capable of determining the difference between the sampled reset signal and both the first storage means and the second storage means.

36. The system of claim 30 wherein each of the pixels further comprises an amplifier.

37. The system of claim 36 wherein each of the pixels further comprises a row select signal as a control input to the amplifier.

38. The system of claim 30 further comprising a summing circuit that combines values stored in the first and second storage mechanisms.

39. The system of claim 30 further comprising a circuit that performs mathematical functions on values stored in the first and second storage mechanisms to determine an effective signal level as a result of the mathematical function performed on values stored in the first and second storage mechanisms.

40. The system of claim 39 wherein the circuit further comprises separate integration timing for each of the photodetector and the sense node.

41. The system of claim 40 wherein the X-Y addressable imager further comprises the circuit performing mathematical functions on values stored in the first and second storage mechanisms to determine an effective signal level as a result of the mathematical function performed on values stored in the first and second storage mechanisms.

42. A method of forming an X-Y addressable MOS imager system having increased dynamic range comprising the steps of:

providing a semiconductor based sensor used within the X-Y addressable MOS imaging system with at least one having a photodetector, a sense node and a reset mechanism operatively configured to the photodetector and the sense node to allow resetting each of the photodetector and the sense node to a predetermined potential, the sense node being formed such that it does not have a light shield allowing the sense node to act as a second photodetector, and the pixel further comprising a transfer mechanism configured to transfer charge from the photodetector to the sense node.

43. The method of claim 42 further comprising the step of forming within the X-Y addressable imager: a first storage mechanism used to a signal level associated with charge accumulated on the sense node; a second storage mechanism used to store a signal level associate with charge accumulated on the photodetector; and a timing circuit for controlling the integration and transfer timing for pixel.

44. The method of claim 42 wherein the providing step further comprises providing a sense node sampling signal for storing a signal level that is associated with charge that has accumulated in the sense node within the second storage mechanism, a reset signal for resetting the sense node after a signal level that is associated with charge accumulated in the sense node has been stored in the second storage mechanism, a transfer signal for transferring a signal level that is associated with charge accumulated within the photodetector to the sense node after the sense node has been reset by the reset signal and a photodetector sampling signal to store a signal level that is associated with charge that has accumulated in the photodetector within the first storage mechanism.

45. The method of claim 43 wherein the step of providing further comprises providing a reset storage device and wherein the step of forming further comprises providing the timing mechanism with a reset sampling signal for sampling a reset potential of the sense node the pixel.

46. The method of claim 43 wherein the step of forming further comprises forming a circuit capable for determining the difference between the sampled reset potential and either the first or second storage mechanisms.

47. The method of claim 46 wherein the step of forming further comprises forming the circuit to determine the difference between the sampled reset signal and both the first storage means and the second storage means.

48. The method of claim 42 wherein the step of providing further comprises providing the pixel with an amplifier.

49. The method of claim 48 wherein the step of providing further comprises providing the pixel with a row select signal as a control input to the amplifier.

50. The method of claim 43 wherein the step of forming further comprises forming a summing circuit that combines values stored in the first and second storage mechanisms.

51. The method of claim 43 wherein the step of forming further comprises forming a circuit that performs mathematical functions on values stored in the first and second storage mechanisms to determine an effective signal level as a result of the mathematical function performed on values stored in the first and second storage mechanisms.

52. The method of claim 51 wherein the step of forming further comprises forming wherein the circuit further comprises separate integration timing for each of the photodetector and the sense node.

53. The method of claim 52 wherein the step of forming further comprises forming further comprises creating the circuit to sum scaled components of values stored in the first and second storage areas.

* * * * *